United States Patent [19]

Kumagai et al.

[11] Patent Number: 5,107,315
[45] Date of Patent: Apr. 21, 1992

[54] MIS TYPE DIAMOND FIELD-EFFECT TRANSISTOR WITH A DIAMOND INSULATOR UNDERCOAT

[75] Inventors: Kazuo Kumagai, Kobe, Japan; Koichi Miyata, Raleigh, N.C.; Shigeaki Miyauchi; Yuichi Matsui, both of Kobe, Japan; Koji Kobashi, Nishinomiya, Japan

[73] Assignee: Kabushiki Kaisha Kobe Seiko Sho, Kobe, Japan

[21] Appl. No.: 668,172

[22] Filed: Mar. 12, 1991

[30] Foreign Application Priority Data

Mar. 13, 1990 [JP] Japan .................................. 2-63827

[51] Int. Cl.⁵ ............................................. H01L 29/78
[52] U.S. Cl. ................................. 357/23.15; 357/22; 357/16; 437/100
[58] Field of Search ................ 437/100; 357/22, 22 I, 357/16, 23.15

[56] References Cited

U.S. PATENT DOCUMENTS

| 4,863,529 | 9/1989 | Imai et al. | 437/100 |
| 4,929,986 | 5/1990 | Yoder | 357/16 |

FOREIGN PATENT DOCUMENTS

| 58-141572 | 8/1983 | Japan | 357/22 I |
| 59-63732 | 4/1984 | Japan | 357/22 I |
| 63-288991 | 11/1988 | Japan | 357/22 I |

OTHER PUBLICATIONS

Appl. Phys. Lett. 46 (2), 15 Jan. 1985, "Growth of Diamond Thin Films by Electron Assisted Chemical Vapor Deposition" by Sawabe et al., pp. 146-147.

Primary Examiner—Rolf Hille
Assistant Examiner—Steven Loke
Attorney, Agent, or Firm—Oblon, Spivak, McClelland, Maier & Neustadt

[57] ABSTRACT

Disclosed herein is a MIS type diamond field-effect transistor comprising a diamond semiconductor layer provided as an active layer by chemical vapor deposition (CVD), and a diamond insulator layer provided on the diamond semiconductor layer also by CVD, a gate electrode being formed on the diamond insulator layer, wherein a diamond insulator undercoat is provided on a non-diamond substrate by CVD, and the diamond semiconductor layer and the diamond insulator layer are sequentially provided on the diamond insulator undercoat. The MIS type diamond field-effect transistor with this structure ensures that in the manufacture thereof, a diamond insulator undercoat of large area can be formed on a non-diamond substrate of CVD, whereby a large number of elemental devices can be fabricated simultaneously.

1 Claim, 3 Drawing Sheets

FIG. 1
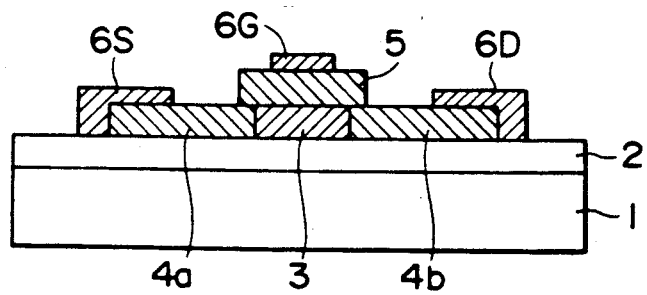
FIG.2(a)
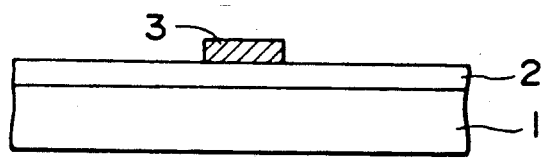
FIG.2(b)
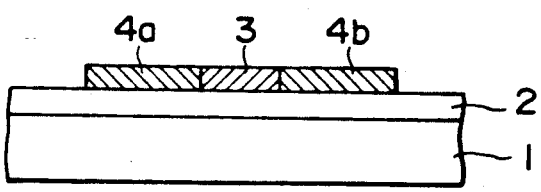
FIG.2(c)
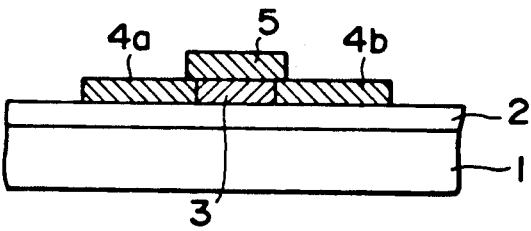
FIG.2(d)
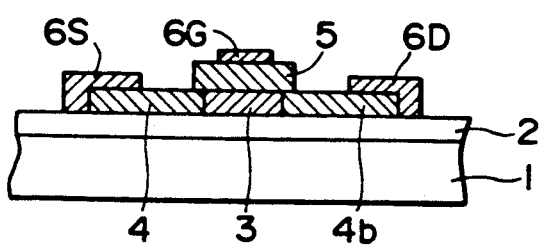
FIG.2(e)

MIS TYPE DIAMOND FIELD-EFFECT TRANSISTOR WITH A DIAMOND INSULATOR UNDERCOAT

BACKGROUND OF THE INVENTION (1) Field of the Invention

This invention relates to a MIS (metal insulator semiconductor) type diamond field-effect transistor which has a structure comprising a thin film of diamond on a non-diamond substrate and is suitable for mass-production.

(2) Description of the Prior Art

Diamond has a large bandgap, as compared with Si (silicon), Sic (silicon carbide) and the like, has a high thermal conductivity and is resistive to heat, radiation, and chemicals. Diamond is therefore expected to be used as an excellent semiconductor material for electronic devices capable of operating normally at high temperatures of about 400° to 500° C. or electronic devices capable of operating under severe conditions. Furthermore, diamond is a good insulator without impurity doping.

Diamond films, having the above-mentioned properties, can be obtained by chemical vapor deposition (CVD). A MIS type diamond field-effect transistor (hereinafter referred to simply as "MIS type diamond FET") using a thin film of diamond synthesized by CVD has been proposed as shown, in section, in FIG. 4 (Japanese Patent Application Laid-Open (KOKAI) No. 64-68966 (1989)).

In the figure, numeral 51 denotes a substrate comprised of a single crystal of diamond, on a major surface of which n-type diamond semiconductor layers 52 and a p-type diamond semiconductor layer 53 are formed. Denoted by 54 is a diamond insulator layer, which is provided on the p-type diamond semiconductor layer 53 in such a condition that portions thereof are located on the n-type diamond semiconductor layers 52. The reference number 55a denotes a source electrode, 55b a gate electrode, and 55c a drain electrode.

The MIS type diamond FET having the above structure is manufactured by a method in which the substrate 51 comprised of a single crystal of diamond is first prepared, and then the n-type diamond semiconductor layer 52, doped with P (phosphorus), is deposited on one major surface of the diamond single crystal substrate 51 by CVD (microwave plasma CVD method).

Thereafter, as a portion at which to form the p-type diamond semiconductor layer 53, a portion of the n-type diamond semiconductor layer 52 is dry-etched by plasma or ion-beam etching, after applying a mask formed of a predetermined metal film such as Cr (chromium) to the other portions of the n-type diamond semiconductor layer 52. Next, the p-type diamond semiconductor layer 53, doped with B (boron), is deposited by CVD, followed by a removal of those portions of the p-type diamond semiconductor layer 53 which are located on the n-type diamond semiconductor layers 52, together with the mask by a lift-off method. Subsequently, the diamond insulator layer 54, which is not doped, is formed by CVD on both the diamond semiconductor layers 52 and 53 provided as above. Then, those portions of the diamond insulator layer 54 which are located on the n-type diamond semiconductor layers 52 are dry-etched in part. Finally, the source electrode 55a, the gate electrode 55b and the drain electrode 55c are provided.

The conventional MIS type diamond FET having the above structure can operate normally in a higher-temperature atmosphere as compared with field-effect transistors using Si or the like as a material thereof. The conventional MIS type diamond FET using the substrate comprised of a single crystal of diamond, however, has the problem of low productivity in the manufacture thereof, because it is not easy to manufacture (grow) a diamond single crystal substrate of large area by a high-pressure synthesis method or the like and, accordingly, it is difficult to fabricate simultaneously a large number of elemental devices on the diamond single crystal substrate.

SUMMARY OF THE INVENTION

This invention contemplates overcoming the above-mentioned problems involved in the prior art.

It is accordingly an object of this invention to provide a MIS type diamond field effect transistor (FET) fabricated on non-diamond substrates as to enable easy mass-production thereof.

According to this invention, there is provided a MIS type diamond FET comprising a diamond semiconductor layer provided as an active layer by CVD, and a diamond insulator layer deposited on the diamond semiconductor layer also by CVD. A gate electrode is formed on the diamond insulator layer. In the MIS type diamond FET, a diamond insulator undercoat is provided on a non-diamond substrate by CVD, and the diamond semiconductor layer and the diamond insulator layer are sequentially deposited on the diamond insulator undercoat.

According to this invention, the MIS type diamond FET having the above structure, ensures that in the manufacture thereof, a diamond insulator undercoat of a large area can be formed on a substrate by CVD, whereby a large number of elemental devices can be fabricated at a time.

The above and other objects, features and advantages of this invention will become apparent from the following description and appended claims, taken in conjunction with the accompanying drawings which show by way of example some preferred embodiments of the invention.

BRIEF DESCRIPTION OF THE DRAWINGS

FIG. 1 is a cross sectional view showing typically the structure of a MIS type diamond FET according to one embodiment of this invention;

FIG. 2, (a) to (e), is a process drawing illustrating an exemplary method of manufacturing the MIS type diamond FET shown in FIG. 1;

DESCRIPTION OF PREFERRED EMBODIMENTS

Figure 3A:
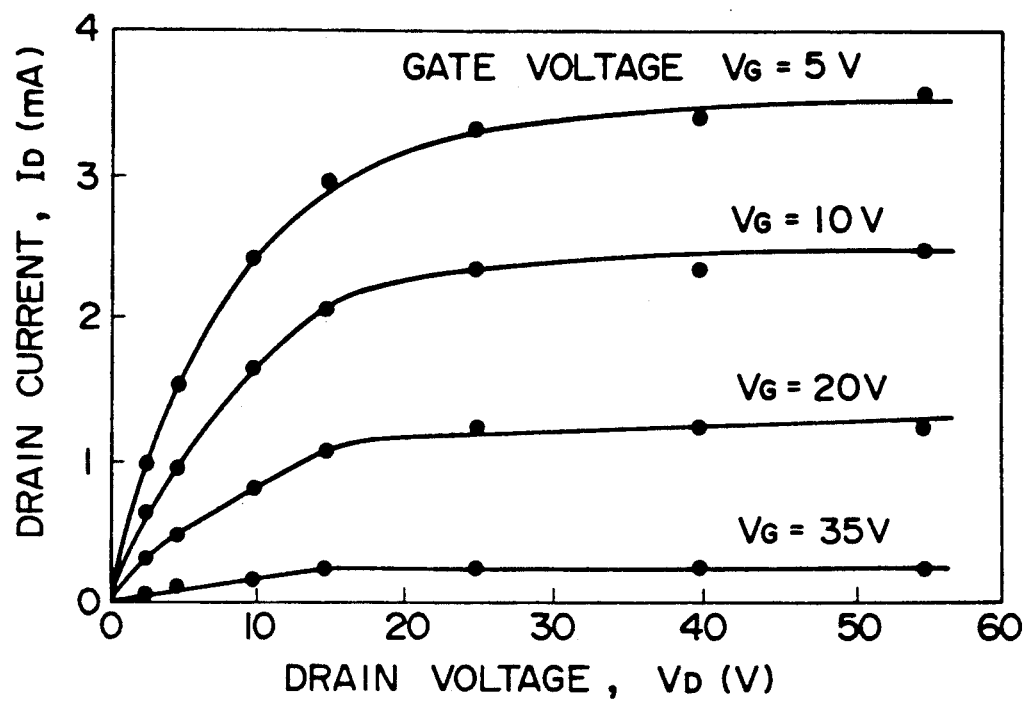
FIG. 3(a) is a view showing an example of drain current-drain voltage characteristic of a MIS type diamond FET according to this invention.

This invention will now be explained more in detail with reference to some preferred embodiments thereof.

FIG. 1 is a cross sectional view showing typically the structure of a MIS type diamond FET according to one embodiment of this invention, and FIG. 2 is a process drawing illustrating an exemplary method of manufacturing the MIS type diamond FET shown in FIG. 1.

In FIG. 1, denoted by 1 is a substrate comprised of Si (silicon wafer), and an insulator undercoat 2 comprised of diamond is formed on one major surface of the Si substrate 1. On the diamond insulator undercoat 2 are provided, a shown in the figure, a p-type diamond semiconductor layer 3 in which to form a channel, an n-type diamond semiconductor layer 4a to be a source region, and an n-type diamond semiconductor layer 4b to be a drain region. On the p-type diamond semiconductor layer 3, furthermore, an insulator layer 5 comprised of diamond is formed in such a condition that portions thereof are located on the n-type diamond semiconductor layers 4a, 4b. A source electrode 6S comprised of a metal showing ohmic contact is provided on the surface of the n-type diamond semiconductor layer 4a. Also, a drain electrode 6D comprised of a metal showing ohmic contact is provided on the surface of the n-type diamond semiconductor layer 4b. Further, a gate electrode 6G is provided on the surface of the diamond insulator layer 5.

Now, a method of manufacturing the MIS type diamond FET having the above structure will be explained according to the procedure of the method, referring to FIG. 2. In FIG. 2, one of a large number of elemental devices which are fabricated simultaneously is shown representatively.

(1) On a Si substrate 1 having a diameter of 3 inches, a diamond insulator undercoat 2 with 2 $\mu$m thickness was formed by microwave plasma CVD (FIG. 2(a)). The synthesis was carried out by using a gas containing 0.5 vol % of methane ($CH_4$) and 99.5 vol % of hydrogen ($H_2$) under the conditions of a microwave output of 500 W, a reaction pressure of 50 Torr, a substrate temperature of 800° C., and a reaction time of 10 hours.

(2) Of the surface of the diamond insulator undercoat 2, the portions other than the portion on which to form a p-type diamond semiconductor layer 3 were covered with a mask formed of a-Si (amorphous silicon). Then, vapor phase synthesis was carried out by microwave plasma CVD, whereby the p-type diamond semiconductor layer 3 doped with B (boron) and having a thickness of 0.4 $\mu$m was formed only on the unmasked portion of the surface of the diamond insulator undercoat 2 (FIG. 2(b)). Thereafter, the mask was removed. The p-type diamond semiconductor layer 3 was formed over an area of 500 $\mu$m square, with a gate width of 50 $\mu$m.

The synthesis was carried out by use of a gas prepared by admixing a raw material gas, containing 0.5 vol % of methane ($CH_4$) and 99.5 vol % of hydrogen ($H_2$), with diborane ($B_2H_6$) to have a diborane concentration of 0.01 ppm under the conditions of a microwave output of 500 W, a reaction pressure of 50 Torr, a substrate temperature of 800° C. and a reaction time of 2 hours.

(3) Next, a mask comprised of a-Si was formed over the areas other than the areas in which to form n-type diamond semiconductor layers 4a, 4b. Thereafter, a vapor phase synthesis was carried out by microwave plasma CVD, whereby the n-type diamond semiconductor layers 4a, 4b doped with Si and having a thickness of 0.4 $\mu$m were formed only over the unmasked areas (FIG. 2(c)). The mask was then removed.

The synthesis was carried out by using a gas prepared by admixing a raw material gas, containing 0.5 vol % of methane and 99.5 vol % of hydrogen, with silane ($SiH_4$) so as to have a silane concentration of 5 ppm, under the conditions of a microwave output of 500 W, a reaction pressure of 50 Torr, a substrate temperature of 800° C. and a reaction time of 2 hours.

(4) Subsequently, a mask comprised of a-Si was formed over the areas other than the area in which to form a diamond insulator layer 5, and vapor phase synthesis was carried out by microwave plasma CVD, whereby the diamond insulator layer 5 with 0.1 $\mu$m thickness was formed over the unmasked area (FIG. 2(d)). Thereafter the mask was removed. The channel length was 100 $\mu$m. The synthesis was carried out under the same conditions as in (1) above, except that the reaction time was 30 minutes.

(5) A metallic electrode having a two-layer structure of Ti and Au was vapor-deposited in a thickness of 1 $\mu$m, and portions of the metallic electrode were then etched away, to form a source electrode 6S, a drain electrode 6D and a gate electrode 6G (FIG. 2(e)).

Then, the MIS type diamond FET wafer thus obtained was separated mechanically by a dicing saw to produce chip form elemental devices, each of which was attached to a holder, and gold wires were bonded to the electrodes, respectively.

Figure 3B:
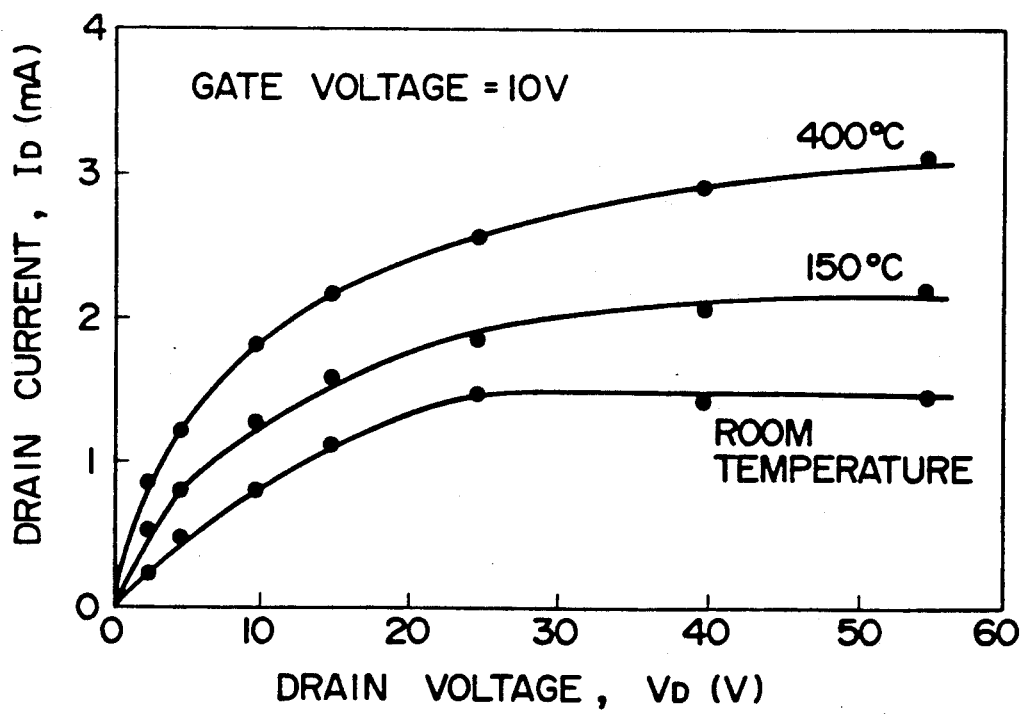
FIG. 3(b) is a view showing an example of the drain current-drain voltage characteristic at varied atmospheric temperatures of the MIS type diamond FET according to this invention.
Figure 4:
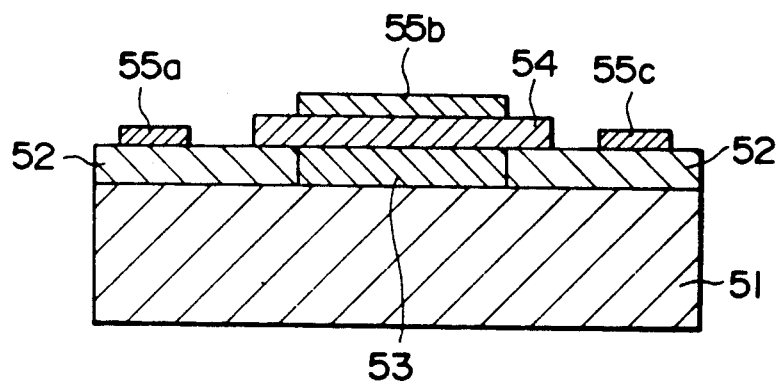
FIG. 4 is a cross sectional view showing typically the structure of a conventional MIS type diamond FET.

An example of drain current-drain voltage characteristic of the MIS type diamond FET manufactured as above is shown in FIG. 3(a), and an example of the drain current-drain voltage characteristic at varied atmospheric temperatures is shown in FIG. 3(b). As shown in FIG. 3(a), the MIS type diamond FET was capable of normal operation without breakdown, even when a drain voltage of 50 V or above was applied. As shown in FIG. 3(b), in addition, the MIS type diamond FET was capable of operating normally, even at a high temperature of 400° C. Furthermore, uniform electrical characteristics were obtained for the elemental devices, without variations from device to device.

Although the above embodiment has had a structure in which the p-type diamond semiconductor layer 3 and n-type diamond semiconductor layers 4a, 4b are formed on the diamond insulator undercoat 2, the structure is not a limitative one, and other structures such as the following may also be used.

One of the other usable structures is such that the operating layer over which the gate electrode 6G is to be formed, with the diamond insulator layer 5 therebetween, is an n-type diamond semiconductor layer, whereas the operating layers serving respectively as the source region and the drain region are p-type diamond semiconductor layers. In this case, the n-type diamond semiconductor layer may be formed by microwave plasma CVD using a gas prepared by admixing a raw material gas, containing 0.5 vol % of methane and 99.5 vol % of hydrogen, with silane to have a silane concentration of 0.01 ppm, whereas the p-type diamond semiconductor layers may be formed by microwave plasma CVD using a gas prepared by adding diborane to the above raw material gas in a concentration of 5 ppm.

In another one of the other usable structures, the operating layer over which the gate electrode 6G is to be formed, with the diamond insulator layer 5 therebetween, is a p-type diamond semiconductor layer, as in the above working example, and the operating layers serving respectively as the source region and the drain region are p+ diamond semiconductor layers. In this case, both the p+ diamond semiconductor layers may be formed by microwave plasma CVD using a gas prepared by adding diborane to the above-mentioned raw material gas in a concentration of 5 ppm.

A different structure may be used wherein the operating layer over which the gate electrode 6G is to be formed, with the diamond insulator layer 5 therebetween, is an n-type diamond semiconductor layer, and the operating layers serving respectively as the source region and the drain region are n+ diamond semiconductor layers. In this case, both the n+ diamond semiconductor layers may be formed by microwave plasma CVD using a gas prepared by adding silane to the above-mentioned raw material gas in a concentration of 5 ppm.

In the above-mentioned embodiment, the p-type and n-type diamond semiconductor layers and the diamond insulator layers have been formed, not by the conventional plasma etching or ion beam etching methods but by a selective deposition technique in which a mask (e.g. a-Si) is formed on the areas other than the area in which a thin film of diamond is to be formed, and the thin film of diamond is directly formed only in the area in which the thin film of diamond is to be formed; therefore, there is a merit that the manufacturing process is simplified as compared with the conventional processes.

As has been described above, the MIS type diamond FET according to this invention has a structure wherein a diamond insulator undercoat is formed on a substrate by CVD, and a diamond semiconductor layer as an operating layer and a gate electrode are provided sequentially on the diamond insulator undercoat. In the manufacture of the MIS type diamond FET, therefore, a diamond insulator undercoat of large area can be formed on the substrate by CVD and accordingly, a large number of elemental devices can be fabricated simultaneously.

It is thus possible, according to this invention, to fabricate a MIS type diamond FET using a thin film of diamond, having uniform electrical characteristics without variations from device to device, and being easy to put to mass-production.

What is claimed is:

1. A MIS type diamond field-effect transistor comprising a diamond semiconductor layer provided as an operating layer by chemical vapor deposition (CVD), and a diamond insulator layer provided on the diamond semiconductor layer also by CVD, a gate electrode being formed on the diamond insulator layer, wherein a diamond insulator undercoat is provided on a non-diamond substrate by CVD, and the diamond semiconductor layer and the diamond insulator layer are sequentially provided on the diamond insulator undercoat.

* * * * *